(12) United States Patent
Choi et al.

(10) Patent No.: US 9,538,666 B2
(45) Date of Patent: Jan. 3, 2017

(54) BONDING STRUCTURE OF ELECTRONIC EQUIPMENT

(71) Applicant: Electronics and Telecommunications Research Institute, Daejeon (KR)

(72) Inventors: Kwang-Seong Choi, Daejeon (KR); Hyun-cheol Bae, Daejeon (KR); Haksun Lee, Daejeon (KR); Yong Sung Eom, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 283 days.

(21) Appl. No.: 14/218,803

(22) Filed: Mar. 18, 2014

(65) Prior Publication Data
US 2015/0043175 A1    Feb. 12, 2015

(30) Foreign Application Priority Data
Aug. 9, 2013    (KR) .................. 10-2013-0094914

(51) Int. Cl.
| H05K 7/10 | (2006.01) |
| H05K 3/34 | (2006.01) |
| H01L 23/48 | (2006.01) |
| H05K 1/02 | (2006.01) |
| H05K 1/11 | (2006.01) |
| H05K 1/14 | (2006.01) |
| H05K 1/18 | (2006.01) |

(52) U.S. Cl.
CPC ............ *H05K 3/3436* (2013.01); *H01L 23/48* (2013.01); *H05K 1/0283* (2013.01); *H05K 1/189* (2013.01); *H05K 2201/10128* (2013.01); *H05K 2201/10734* (2013.01); *Y02P 70/613* (2015.11)

(58) Field of Classification Search
CPC ................ H01L 23/48; H01L 2924/15311
USPC ....... 361/767, 770, 772, 773, 774, 777, 803, 361/808; 174/527, 528, 534, 549, 551, 174/557
See application file for complete search history.

(56) References Cited

U.S. PATENT DOCUMENTS

| 7,626,202 B2 | 12/2009 | Yamazaki |
| 7,662,708 B2 | 2/2010 | Fork et al. |
| 8,148,253 B2 | 4/2012 | Ozono et al. |
| 8,217,381 B2 * | 7/2012 | Rogers ............... H01L 21/8258 257/40 |
| 2011/0254146 A1 * | 10/2011 | Cho ....................... H01L 24/29 257/692 |

(Continued)

FOREIGN PATENT DOCUMENTS

KR    10-2008-0072523 A    8/2008

OTHER PUBLICATIONS

Seung-Ho Kim et al., "High Productivity and Damage-free Ultrasonic Anisotropic Conductive Film (ACF) Bonding for Touch Screen Panel (TSP) Assemblies", Electronic Components and Technology Conference (ECTC), May 29, 2012, pp. 1770-1773.

*Primary Examiner* — Binh Tran

(57) ABSTRACT

Provided is a bonding structure of an electronic equipment including first electrodes extended in a first direction and arranged in a second direction on a stretchable display panel having stretchability, second electrodes extended in a first direction and arranged in a second direction on a substrate and facing the first electrodes, and solder bonding parts interposed between the first electrodes and the second electrodes, facing each other in the second direction, and constituting a plurality of rows in the first direction.

15 Claims, 5 Drawing Sheets

(56) References Cited

U.S. PATENT DOCUMENTS

2012/0014078 A1* 1/2012 Watanabe ............ H05K 7/1061
361/760
2014/0146507 A1* 5/2014 Lee ................... H01L 23/49822
361/783

* cited by examiner

BONDING STRUCTURE OF ELECTRONIC EQUIPMENT

CROSS-REFERENCE TO RELATED APPLICATIONS

This U.S. non-provisional patent application claims priority under 35 U.S.C. §119 of Korean Patent Application No. 10-2013-0094914, filed on Aug. 9, 2013, the entire contents of which are hereby incorporated by reference.

BACKGROUND OF THE INVENTION

The present disclosed herein relates to a bonding structure of an electronic equipment, and more particularly, to a bonding structure of an electronic equipment including a stretchable display.

Recently, a electronic equipment has a general constitution of connecting an stretchable display with an electronic circuit module installed on a rigid substrate. To connect the stretchable display and the circuit of the rigid substrate, a connection method using an anisotropic conductive film (ACF) is known.

The ACF has a dispersed state of conductive particles into a polymer. The ACF is disposed between the stretchable display and the rigid substrate for connection, and heat and pressure are applied. By the conductive particles disposed between an electrode included in the stretchable display and another electrode included in the rigid substrate, the stretchable display and the rigid substrate are electrically connected through mechanical contact. However, since the electrical contact of the conductive particles with the electrodes is kept by the polymer, the conductive particles are easily separated from the electrodes by external stress. In this case, electrical resistance may increase, and defects of the electronic equipments may be generated.

SUMMARY OF THE INVENTION

The present disclosure provides a bonding structure of an electronic equipment including an stretchable display having improved reliability and high stretchability.

The tasks to be solved by the present inventive concept is not limited to the above-described task, however other tasks not mentioned will be precisely understood from the following description by a person skilled in the art.

Embodiments of the inventive concept provide bonding structures of an electronic equipment including first electrodes extending in a first direction and arranged in a second direction on a stretchable display pane, second electrodes extending in a first direction and arranged in a second direction on a substrate and facing the first electrodes, and solder bonding parts interposed between the first electrodes and the second electrodes, the solder bonding parts facing each other in the second direction, and arranged to configure a plurality of rows in the first direction.

In some embodiments, the stretchable display panel may be a liquid crystal display panel, an organic light-emitting diode (OLED) display panel, an electrophoresis display panel, an electrowetting display panel, a microelectromechanical systems (MEMS) display panel or or flexible electronics.

In other embodiments, the substrate may be a semiconductor substrate, a flexible substrate or a wiring substrate, including an IC chip.

In still other embodiments, the bonding structure of an electronic equipment may further include a first insulating layer formed on the stretchable display panel, the first insulating layer exposing top surfaces of the first electrodes, a second insulating layer formed on the substrate the second insulating layer exposing top surfaces of the second electrodes, and an underfill resin layer disposed between the first insulating layer and the second insulating layer.

In even other embodiments, the first insulating layer and the second insulating layer may be solder resist layers obtained by curing a photoresist or passivation layers including silicon oxide or silicon nitride.

In yet other embodiments, the bonding structure of an electronic equipment may further include first under bump metallization (UBM) pads disposed between the first electrodes and the solder bonding parts, a first insulating layer formed on the stretchable display panel, the first insulating layer covering the first electrodes and separating the first UBM pads, second UBM pads disposed between the second electrodes and the solder bonding parts, a second insulating layer formed on the substrate, the second insulating layer covering the second electrodes and separating the second UBM pads, and an underfill resin layer disposed between the first insulating layer and the second insulating layer.

In further embodiments, the first UBM pads and the second UBM pads may be a single metal or an alloy including at least one among titanium (Ti), titanium tungsten (TiW), chromium (Cr), copper (Cu), nickel (Ni), gold (Au), palladium (Pd) and silver (Ag).

In still further embodiments, the solder bonding parts may be a single metal or an alloy including at least one among indium (In), tin (Sn), bismuth (Bi), silver (Ag), copper (Cu), zinc (Zn) and lead (Pb).

In even further embodiments, the bonding structure of an electronic equipment may further include a first intermetallic compound layer formed between the first UBM pads and the solder bonding parts, and a second intermetallic compound layer formed between the second UBM pads and the solder bonding parts.

In yet further embodiments, the first intermetallic compound layer may be a metal layer including metal elements included in the first UBM pads and metal elements included in the solder bonding parts, and the second intermetallic compound layer may be a metal layer including metal elements included in the second UBM pads and metal elements included in the solder bonding parts.

In much further embodiments, the bonding structure of an electronic equipment may further include a first UBM layer disposed between the first electrodes and the solder bonding parts and covering top surfaces of the first electrodes, a first insulating layer formed on the stretchable display panel the first insulating layer exposing a top surface of the first UBM layer, a second UBM layer disposed between the second electrodes and the solder bonding parts and covering top surfaces of the second electrodes, a second insulating layer formed on the substrate, the second insulating layer exposing a top surface of the second UBM layer, and an underfill resin layer disposed between the first insulating layer and the second insulating layer.

In still much further embodiments, the bonding structure of an electronic equipment may further include a first intermetallic compound layer formed between the first UBM layer and the solder bonding parts, and a second intermetallic compound layer formed between the second UBM layer and the solder bonding parts.

In other embodiments of the inventive concept, bonding structures of an electronic equipment include first electrodes extending in a first direction on a stretchable display panel and including row electrodes and column electrodes, the first electrodes arranged in a second direction, second electrodes facing the first electrodes and extending in the first direction on a substrate, the second electrodes arranged in the second direction, and solder bonding parts interposed between the first electrodes and the second electrodes and arranged to configure a plurality of rows in the first direction, the solder bonding parts facing each other in the second direction. The row electrodes are arranged in parallel in the first direction, and the column electrodes cross the row electrodes and arranged in parallel in the second direction.

In some embodiments, the solder bonding parts may be formed in a crossing region of the row electrodes and the column electrodes.

In other embodiments, the row electrodes and the column electrodes may have a curved shape.

In still other embodiments, the bonding structure of an electronic equipment may further include first UBM pads disposed between the first electrodes and the solder bonding parts, a first insulating layer formed on the stretchable display panel, the first insulating layer covering the first electrodes and separating the first UBM pads, second UBM pads disposed between the second electrodes and the solder bonding parts, a second insulating layer formed on the substrate, the second insulating layer covering the second electrodes and separating the second UBM pads, and an underfill resin layer disposed between the first insulating layer and the second insulating layer.

In even other embodiments, the bonding structure of an electronic equipment may further include a first intermetallic compound layer formed between the first UBM pads and the solder bonding parts, and a second intermetallic compound layer formed between the second UBM pads and the solder bonding parts.

The bonding structure of the electronic equipment according to exemplary embodiments of the inventive concept includes solder bonding parts between a first electrode of a stretchable display panel and a second electrode of a substrate. The solder bonding parts may perform mechanical and electrical bonding function between the first electrode and the second electrode. Therefore, electrical properties between the display panel and the substrate may be maintained by external stress, and mechanical reliability may be kept.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
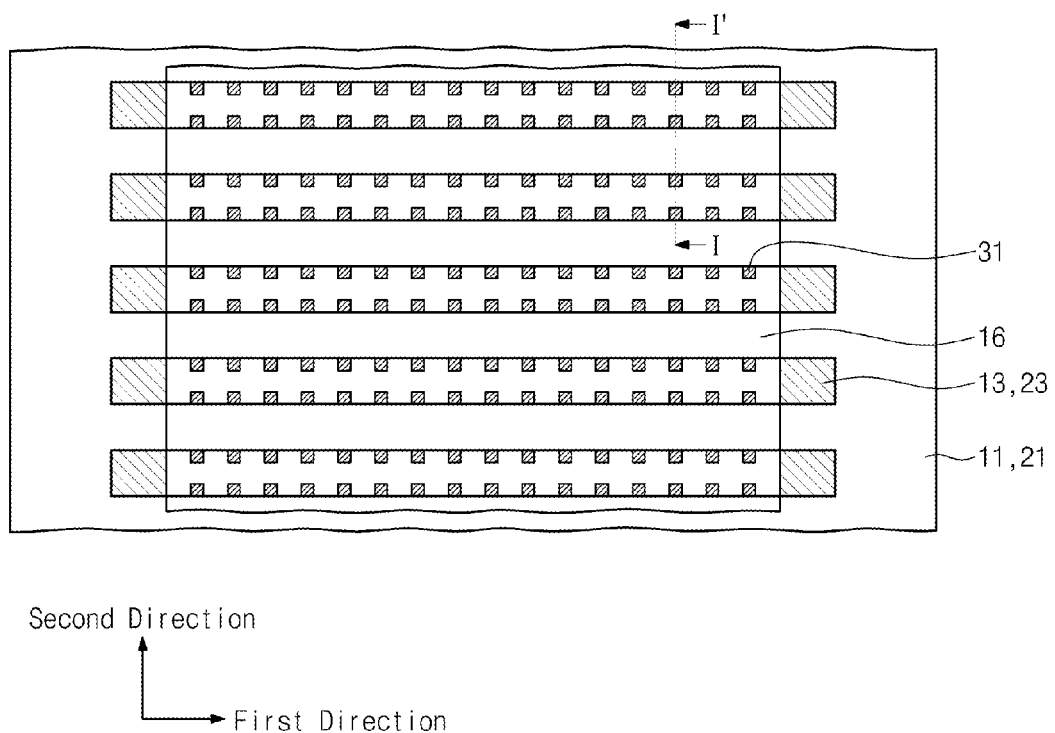
FIG. 1 is a plan view illustrating a bonding structure of an electronic equipment according to an embodiment of the inventive concept.

The advantages and the features of the inventive concept, and methods for attaining them will be described in example embodiments below with reference to the accompanying drawings. The inventive concept may, however, be embodied in different forms and should not be construed as limited to the embodiments set forth herein. Rather, these embodiments are provided so that this description will be thorough and complete, and will fully convey the scope of the present inventive concept to those skilled in the art.

The terminology used herein is for the purpose of describing particular example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated features, steps, operations, and/or devices, but do not preclude the presence or addition of one or more other features, steps, operations, and/or devices thereof.

In addition, example embodiments are described herein with reference to cross-sectional views and/or plan views that are schematic illustrations of idealized example embodiments. In the drawings, the sizes and relative sizes of layers and regions may be exaggerated for effective explanation of technical contents. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature and their shapes are not intended to illustrate the actual shape of a region of a device and are not intended to limit the scope of the present inventive concept.

Figure 2:
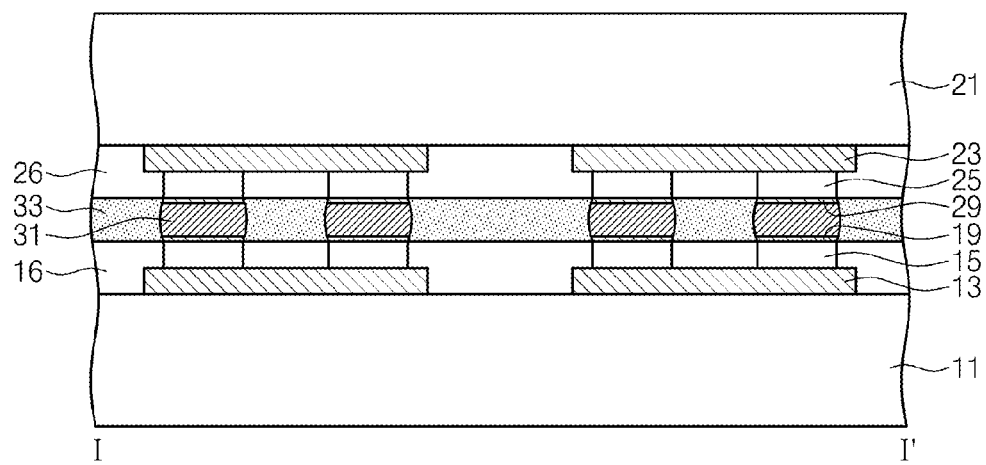
FIG. 2 is a cross-sectional view taken along line I-I' in FIG. 1, illustrating a bonding structure of an electronic equipment according to an embodiment of the inventive concept.
Figure 3:
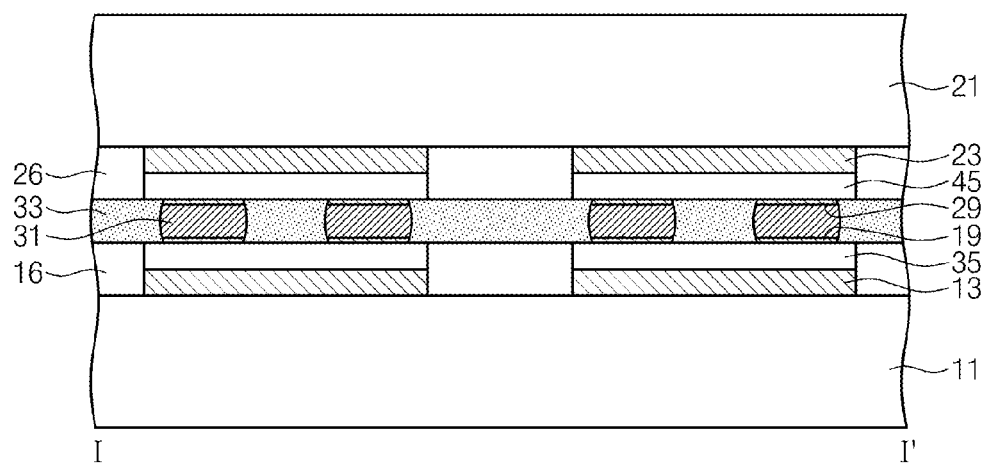
FIG. 3 is a cross-sectional view taken along line I-I' in FIG. 1, illustrating a bonding structure of an electronic equipment according to another embodiment of the inventive concept.

FIG. 1 is a plan view illustrating a bonding structure of an electronic equipment according to an embodiment of the inventive concept. FIG. 2 is a cross-sectional view taken along line I-I' in FIG. 1, illustrating a bonding structure of an electronic equipment according to an embodiment of the inventive concept. FIG. 3 is a cross-sectional view taken along line I-I' in FIG. 1, illustrating a bonding structure of an electronic equipment according to another embodiment of the inventive concept.

Referring to FIGS. 1 and 2, first electrodes 13 may be disposed on a display panel 11. The display panel 11 may be a stretchable display panel. The stretchable display panel may be a liquid crystal display panel, an organic light-emitting diode (OLED) display panel, an electrophoresis display panel, an electrowetting display panel or a micro-electromechanical systems (MEMS) display panel. The first electrodes 13 may be extended in a first direction and may be arranged in a second direction. The display panel 11 and the first electrodes 13 may be electrically connected. The first electrodes 11 may include a metal material.

On the first electrodes 13, first under bump metallization (UBM) pads 15 may be formed. The first UBM pads 15 may be formed on the first electrodes 13 with a gap in the second direction and may be arranged in the first direction. The first UBM pads 15 may be a single metal or an alloy including at least one of titanium (Ti), titanium tungsten (TiW), chromium (Cr), copper (Cu), nickel (Ni), gold (Au), palladium (Pd) and silver (Ag).

A first insulating layer 16 may be formed on the display panel 11. Particularly, the first insulating layer 16 may be formed on the display panel 11 so as to completely cover the first electrodes 13, to fill up between the first electrodes 13 and to expose the top surfaces of the first UBM pads 15. The first insulating layer 16 may be a solder resist layer formed by curing a photoresist or a passivation layer including silicon oxide.

Second electrodes 23 may be dispose on a substrate 21, d. The substrate 21 may be a semiconductor substrate, a flexible substrate or a wiring substrate including an IC chip. The second electrodes 23 may be disposed to face the first electrodes 13. The second electrodes 23 may be extended in the first direction and may be arranged in the second direction like the first electrodes 13. The substrate 21 and the second electrodes 23 may be electrically connected.

Second UBM pads 25 may be formed on the second electrodes 23. The second UBM pads 25 may be formed on the second electrodes 23 with a gap in the second direction and may be arranged in the first direction. The second UBM pads 25 may be formed to face the first UBM pads 15. The second UBM pads 25 may be a single metal or an alloy including at least one of titanium (Ti), titanium tungsten (TiW), chromium (Cr), copper (Cu), nickel (Ni), gold (Au), palladium (Pd) and silver (Ag). The first and second UBM pads 15 and 25 may play the role of improving adhesiveness between the first electrode 15 and solder bonding parts 31, and between the second electrode 25 and the solder bonding parts 31.

A second insulating layer 26 may be formed on the substrate 21. Particularly, the second insulating layer 26 may be formed on the substrate 21 so as to completely cover the second electrodes 23, to fill up between the second electrodes 23 and to expose the top surfaces of the second UBM pads 25. The second insulating layer 26 may be a solder resist layer formed by curing a photoresist or a passivation layer including silicon oxide.

Between the first UBM pads 15 and the second UBM pads 25, the solder bonding parts 31 are interposed. The solder bonding parts 31 may play the role of electrically connecting the display panel 11 and the substrate 21. The solder bonding parts 31 may be a single metal or an alloy including at least one of indium (In), tin (Sn), bismuth (Bi), silver (Ag), copper (Cu), zinc (Zn) and lead (Pb).

The space between the first insulating layer 16 and the second insulating layer 26, in which the solder bonding parts 31 are disposed, may be filled up with an underfill resin layer 33. The underfill resin layer 33 may be a complex material of an epoxy-based resin and an inorganic filler. The underfill resin layer 33 may disperse the stress applied to the solder bonding parts 31, and passivate the solder bonding parts 31 from thermal stress or chemical impact due to external environment at the same time.

Between the first UBM pads 15 and the solder particles 31, a first intermetallic compound layer 19 may be formed, and between the second UBM pads 25 and the solder bonding parts 31, a second intermetallic compound layer 29 may be formed. The first and second intermetallic compound layers 19 and 29 may be formed through the bonding of a metal material included in the first and second UBM pads 15 and 25 with a metal material included in the solder bonding parts 31. More particularly, during heating and reflowing the solder bonding parts 31 to connect the solder bonding parts 31 to the first and second UBM pads 15 and 25, the metal material included in the solder bonding parts 31 and the metal material included in the first and second UBM pads 15 and 25 may be combined. The first intermetallic compound layer 19 may be a metal layer including metal elements included in the first UBM pads 15 and metal elements included in the solder bonding parts 31. The second intermetallic compound layer 29 may be a metal layer including metal elements included in the second UBM pads 25 and metal elements included in the solder bonding parts 31. The first and second UBM pads 15 and 25 may be realized between the first electrode 13 and the solder bonding parts 31 and between the second electrode 23 and the solder bonding parts 31 so as to have a more reliable adhesive surface.

According to an embodiment of the inventive concept, the first and second UBM pads 15 and 25 and the solder bonding parts 31 may be formed between the first electrodes 13 and the second electrodes 23 for mechanical and electrical connection. In addition, the first electrodes 13 and the second electrodes 23 may not participate in the mechanical or electrical connection function however may play the role of stretchable modification with respect to external stress applied to the display panel 11 and the substrate 21. Thus, constant electrical properties may be maintained between the first and second electrodes 13 and 23 under the external stress, and an easy modification according to the external stress may be possible.

According to another embodiment of the inventive concept, and referring to FIG. 3, the first UBM layers 35 may be extended in the first direction and may be arranged in the second direction on the first electrodes 13 like the first electrodes 13. Thus, the first UBM layers 35 may completely cover the top surfaces of the first electrodes 13. Likewise, the second UBM layers 45 may be extended in the first direction and may be arranged in the second direction on the second electrodes 23 like the second electrodes 23. Thus, the second UBM layers 45 may completely cover the top surfaces of the second electrodes 23. In this case, the first UBM layers 35 and the second UBM layers 45 may perform the stretch function between the display panel 11 and the substrate 21 like the first electrodes 13 and the second electrodes 13.

Figure 4:
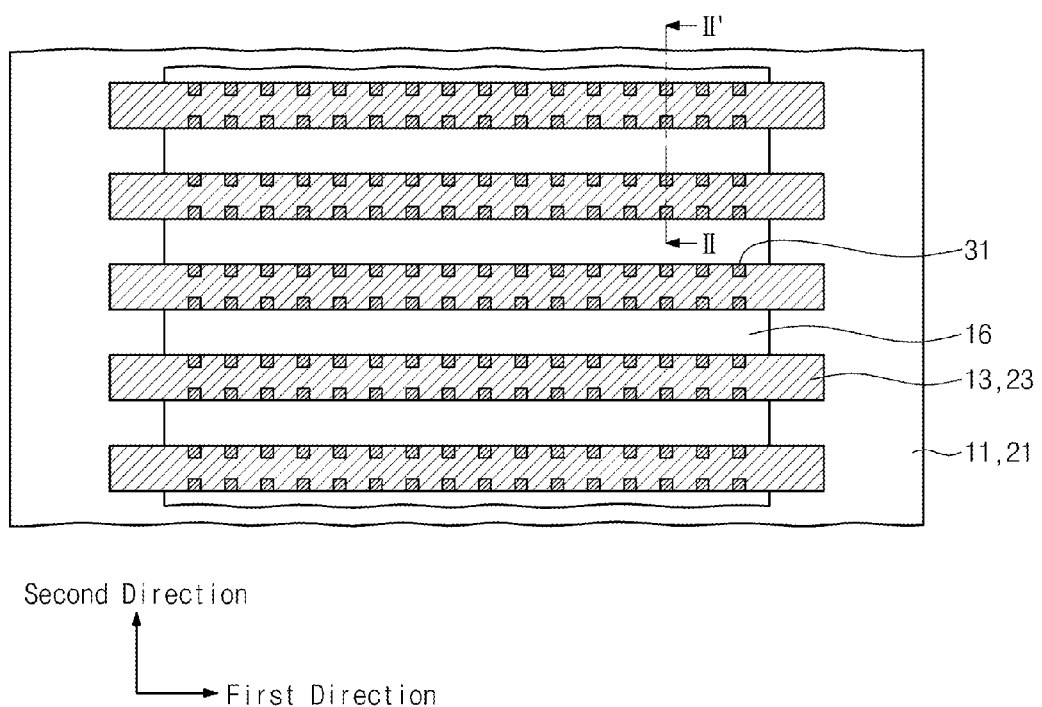
FIG. 4 is a plan view illustrating a bonding structure of an electronic equipment according to further another embodiment of the inventive concept.
Figure 5:
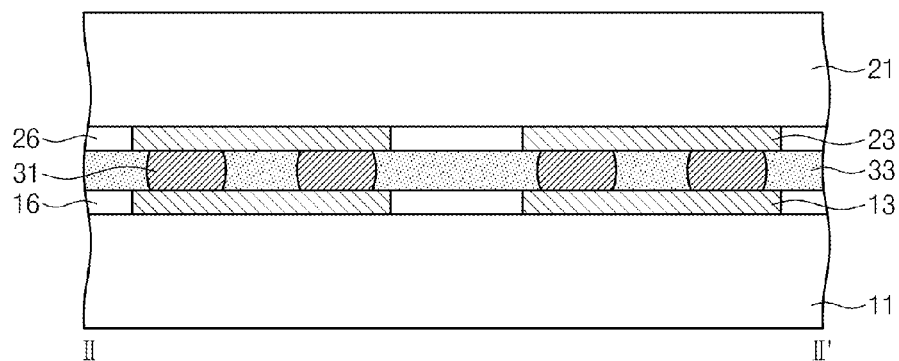
FIG. 5 is a cross-sectional view taken along line II-II' in FIG. 4, illustrating a bonding structure of an electronic equipment according to further another embodiment of the inventive concept.

FIG. 4 is a plan view illustrating a bonding structure of an electronic equipment according to further another embodiment of the inventive concept. FIG. 5 is a cross-sectional view taken along line II-IF in FIG. 4, illustrating a bonding structure of an electronic equipment according to further another embodiment of the inventive concept. For brevity of explanation, the same reference numerals are used for substantially the same constituting elements in the embodiment, and explanation on corresponding constituting elements will be omitted in further another embodiment illustrated in FIGS. 4 and 5.

On the display panel 11, the first insulating layer 16 exposing the top surfaces of the first electrodes 13 may be formed. On the second substrate 21, the second insulating layer 26 exposing the top surfaces of the second electrodes 23 may be formed. In addition, the solder bonding parts 31 may be formed between the first electrodes 13 and the second electrodes 23 so that the solder bonding parts 31 may make direct contact with the first and second electrodes 13 and 23. A pair of the solder bonding parts 31 in the second direction may be arranged so as to configure a plurality of rows in the first direction.

At the interface of the first electrode 13 contacting the solder bonding parts 31 and the solder bonding parts 31, an intermetallic compound layer (not illustrated) may be formed. Alternatively, at the interface of the second electrode 23 contacting the solder bonding parts 31 and the solder bonding parts 31, an intermetallic compound layer may not be formed. Likewise, at the interface of the second electrode 23 contacting the solder bonding parts 31 and the solder bonding parts 31, an intermetallic compound may be formed or may not be formed.

Figure 6:
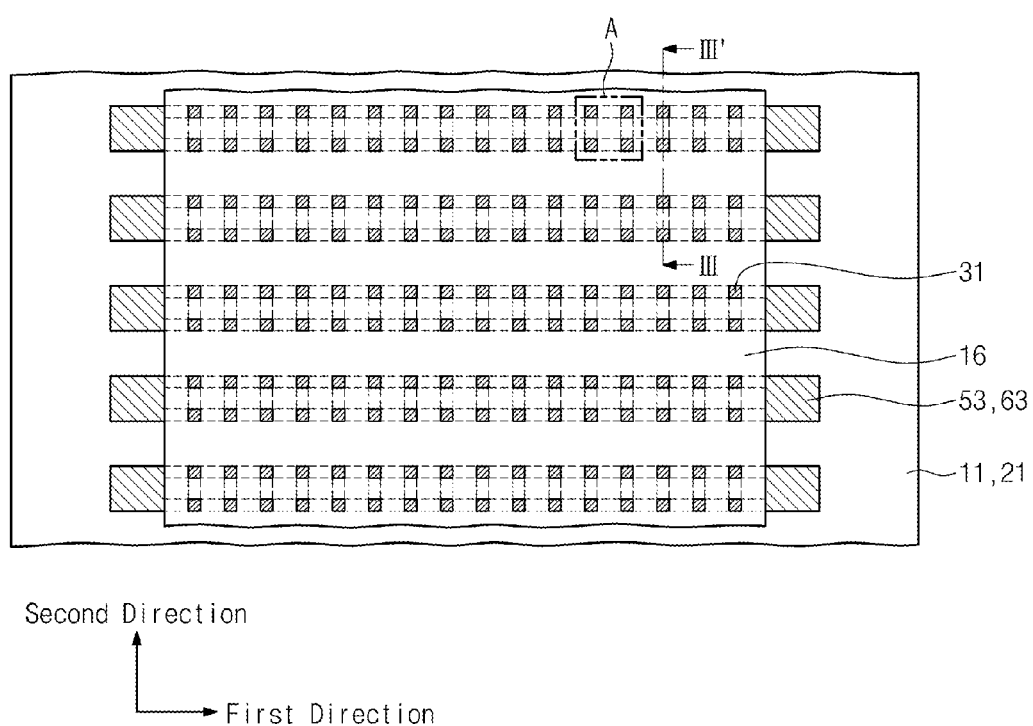
FIG. 6 is a plan view illustrating a bonding structure of an electronic equipment according to further another embodiment of the inventive concept.
Figure 7:
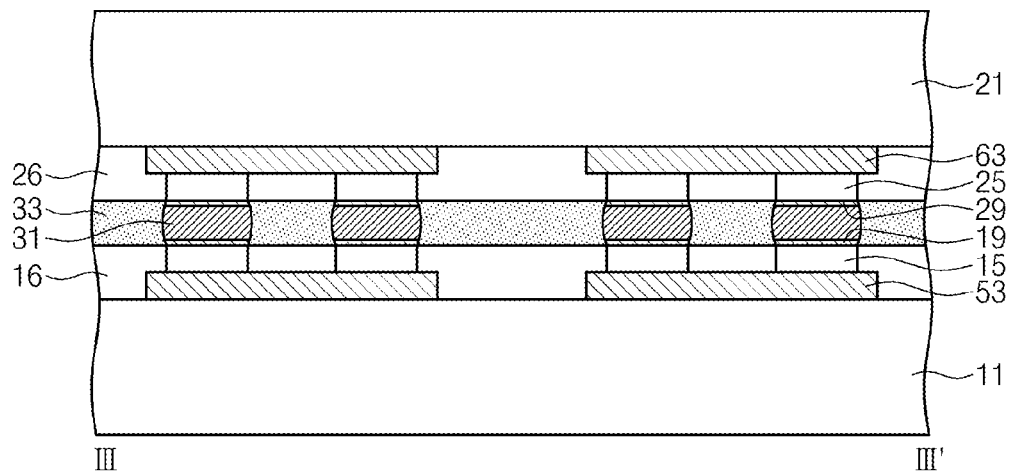
FIG. 7 is a cross-sectional view taken along line III-III' in FIG. 6, illustrating a bonding structure of an electronic equipment according to further another embodiment of the inventive concept.
Figure 8A:
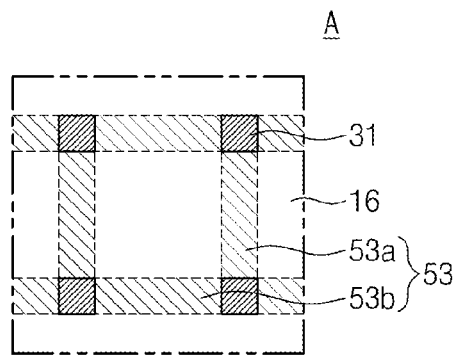
FIGS. 8A and 8B are enlarged plan views of part A in FIG. 6, illustrating a bonding structure of an electronic equipment according to further another embodiment of the inventive concept.
Figure 8B:
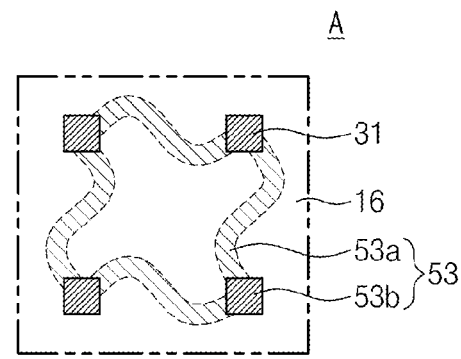

FIG. 6 is a plan view illustrating a bonding structure of an electronic equipment according to further another embodiment of the inventive concept. FIG. 7 is a cross-sectional view taken along line III-III' in FIG. 6, illustrating a bonding structure of an electronic equipment according to further another embodiment of the inventive concept. FIGS. 8A and 8B are enlarged plan views of part A in FIG. 6, illustrating a bonding structure of an electronic equipment according to further another embodiment of the inventive concept. For brevity of explanation, the same reference numerals are used for substantially the same constituting elements in the embodiment, and explanation on corresponding constituting elements will be omitted in further another embodiment illustrated in FIG. 6.

Referring to FIGS. 6, 7 and 8A, first electrodes 53 may be patterned, thereby being extended in the first direction and being arranged in the second direction. Particularly, the first electrodes 53 include column electrodes 53a and row electrodes 53b. The row electrodes 53b may be arranged in parallel in the first direction, and a plurality of the column electrodes 53a may be arranged in parallel in the second direction between the row electrodes 53b. The column electrodes 53a may cross the row electrodes 53b, and the first UBM pads 15 and the solder bonding parts 31 may be disposed in the overlapping regions of the column electrodes 53a and the row electrodes 53b. In another embodiment, as illustrated in FIG. 8B, the first electrodes 53 may include the column electrodes 53a and the row electrodes 53b of a curved shape. Even though not illustrated in the drawings, the second electrodes 63 may also have the same shape as the first electrodes 53.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A bonding structure of an electronic equipment, comprising:
    first electrodes extending in a first direction and arranged in a second direction, the first electrodes being disposed on a stretchable display panel;
    second electrodes extending in the first direction and arranged in the second direction, the second electrodes being disposed on a substrate, the second electrodes facing the first electrodes;
    solder bonding parts interposed between the first electrodes and the second electrodes, the solder bonding parts facing each other in the second direction and arranged to configure a plurality of rows in the first direction;
    first under bump metallization (UBM) pads disposed between the first electrodes and the solder bonding parts;
    a first insulating layer disposed on the stretchable display panel, the first insulating layer covering the first electrodes and separating the first UBM pads;
    second UBM pads disposed between the second electrodes and the solder bonding parts;
    a second insulating layer disposed on the substrate, the second insulating layer covering the second electrodes and separating the second UBM pads; and
    an underfill resin layer disposed between the first insulating layer and the second insulating layer.

2. The bonding structure of claim 1, wherein the stretchable display panel is a liquid crystal display panel, an organic light-emitting diode (OLED) display panel, an electrophoresis display panel, an electrowetting display panel, a microelectromechanical systems (MEMS) display panel or flexible electronics.

3. The bonding structure of claim 1, wherein the substrate is a semiconductor substrate including an integrated circuit (IC) chip, a flexible substrate, or a wiring substrate, including an IC chip.

4. The bonding structure of claim 1, wherein:
    the first insulating layer exposes portions of top surfaces of the first electrodes; and
    the second insulating layer exposes portions of top surfaces of the second electrodes.

5. The bonding structure of claim 4, wherein the first insulating layer and the second insulating layer are solder resist layers or passivation layers, the solder resist layers being obtained by curing a photoresist, the passivation layers including silicon oxide or silicon nitride.

6. The bonding structure of claim 1, wherein the first UBM pads and the second UBM pads are a single metal or an alloy, the first UBM pads and the second UBM pads including at least one among titanium (Ti), titanium tungsten (TiW), chromium (Cr), copper (Cu), nickel (Ni), gold (Au), palladium (Pd) and silver (Ag).

7. The bonding structure of claim 1, wherein the solder bonding parts are a single metal or an alloy, the solder bonding parts including at least one among indium (In), tin (Sn), bismuth (Bi), silver (Ag), copper (Cu), zinc (Zn) and lead (Pb).

8. The bonding structure of claim 1, further comprising:
    a first intermetallic compound layer disposed between the first UBM pads and the solder bonding parts; and
    a second intermetallic compound layer disposed between the second UBM pads and the solder bonding parts.

9. The bonding structure of claim 8, wherein the first intermetallic compound layer is a metal layer including one or more metal elements included in the first UBM pads and one or more metal elements included in the solder bonding parts, and the second intermetallic compound layer is a metal layer including one or more metal elements included in the second UBM pads and one or more metal elements included in the solder bonding parts.

10. A bonding structure of an electronic equipment, comprising:
   first electrodes extending in a first direction, the first electrodes being disposed on a stretchable display panel and including row electrodes and column electrodes, the first electrodes being arranged in a second direction, wherein the row electrodes are arranged in the second direction and extending in the first direction, and the column electrodes intersect with the row electrodes such that the column electrodes are arranged in the first direction and extend in the second direction:
   second electrodes facing the first electrodes and extending in the first direction, the second electrodes being disposed on a substrate, the second electrodes being arranged in the second direction; and
   solder bonding parts interposed between the first electrodes and the second electrodes and arranged to configure a plurality of rows in the first direction, the solder bonding parts facing each other in the second direction;
   first under bump metallization (UBM) pads disposed between the first electrodes and the solder bonding parts;
   a first insulating layer disposed on the stretchable display panel, the first insulating layer covering the first electrodes and separating the first UBM pads;
   second UBM pads disposed between the second electrodes and the solder bonding parts;
   a second insulating layer disposed on the substrate, the second insulating layer covering the second electrodes and separating the second UBM pads; and
   an underfill resin layer disposed between the first insulating layer and the second insulating layer.

11. The bonding structure of claim 10, wherein the solder bonding parts are disposed at intersections of the row electrodes and the column electrodes.

12. The bonding structure of claim 10, wherein the row electrodes and the column electrodes have a curved shape.

13. The bonding structure of claim 10, further comprising:
   a first intermetallic compound layer disposed between the first UBM pads and the solder bonding parts; and
   a second intermetallic compound layer disposed between the second UBM pads and the solder bonding parts.

14. A bonding structure of an electronic equipment, comprising:
   first electrodes extending in a first direction and arranged in a second direction, the first electrodes being disposed on a stretchable display panel;
   second electrodes extending in the first direction and arranged in the second direction, the second electrodes being disposed on a substrate, the second electrodes facing the first electrodes;
   solder bonding parts interposed between the first electrodes and the second electrodes, the solder bonding parts facing each other in the second direction and arranged to configure a plurality of rows in the first direction;
   first under bump metallization (UBM) layers disposed between the first electrodes and the solder bonding parts, each of the first UBM layers covering a surface of a corresponding one of the first electrodes;
   a first insulating layer disposed on the stretchable display panel and between adjacent first UBM layers;
   second UBM layers disposed between the second electrodes and the solder bonding parts, each of the second UBM layers covering a surface of a corresponding one of the second electrodes;
   a second insulating layer disposed on the substrate and between adjacent second UBM layers; and
   an underfill resin layer disposed between the first insulating layer and the second insulating layer.

15. The bonding structure of claim 14, further comprising:
first intermetallic compound layers disposed between the first UBM layers and the solder bonding parts; and
second intermetallic compound layers disposed between the second UBM layers and the solder bonding parts.

* * * * *